United States Patent
Cheng et al.

(10) Patent No.: US 9,029,208 B2
(45) Date of Patent: May 12, 2015

(54) SEMICONDUCTOR DEVICE WITH REPLACEMENT METAL GATE AND METHOD FOR SELECTIVE DEPOSITION OF MATERIAL FOR REPLACEMENT METAL GATE

(71) Applicant: International Business Machines Corporation, Armonk, NY (US)

(72) Inventors: Kangguo Cheng, Schenectady, NY (US); Junli Wang, Singerlands, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 13/690,867

(22) Filed: Nov. 30, 2012

(65) Prior Publication Data
US 2014/0154846 A1 Jun. 5, 2014

(51) Int. Cl.
*H01L 21/00* (2006.01)
*H01L 29/66* (2006.01)
*H01L 29/786* (2006.01)

(52) U.S. Cl.
CPC .... *H01L 29/66545* (2013.01); *H01L 29/66772* (2013.01); *H01L 29/78618* (2013.01); *H01L 29/78654* (2013.01)

(58) Field of Classification Search
CPC ........................................................ H01L 29/66
USPC .......................................................... 438/151
See application file for complete search history.

(56) References Cited

U.S. PATENT DOCUMENTS

| | | | | |
|---|---|---|---|---|
| 6,127,233 | A * | 10/2000 | Rodder | 438/300 |
| 6,815,297 | B1 * | 11/2004 | Krivokapic et al. | 438/287 |
| 6,864,540 | B1 | 3/2005 | Divakaruni et al. | |
| 7,060,546 | B2 * | 6/2006 | Hsu et al. | 438/197 |
| 7,271,455 | B2 | 9/2007 | Cabral, Jr. et al. | |
| 7,531,437 | B2 | 5/2009 | Brask et al. | |
| 7,569,443 | B2 | 8/2009 | Kavalieros et al. | |
| 7,648,868 | B2 * | 1/2010 | Majumdar et al. | 438/198 |

(Continued)

OTHER PUBLICATIONS

In Situ Co/SiC(N,H) Capping Layers for Cu/Low-k Interconnects; C.-C. Yang, B. U. H, Shobha, S. Nguyen, A. Grill. W. Ye, J. AuBuchon. M. Shek, and D. Edelstein; IEEE Electron Device Letters, vol. 33, No. 4, Apr. 2012 (3 pages).

(Continued)

*Primary Examiner* — Caleb Henry
(74) *Attorney, Agent, or Firm* — Harrington & Smith; Louis J. Percello

(57) ABSTRACT

In a method of fabricating a semiconductor device, a silicon-on-insulator (SOI) substrate is provided. This SOI substrate comprises a buried oxide layer and an ETSOI layer between the buried oxide layer and a surface of the SOI substrate. A dummy gate is formed on the ETSOI. At least two raised source/drain regions are epitaxially formed adjacent to the dummy gate, and a protective cap is formed thereon. An etch process employing at least one acid is used to remove the dummy gate from the ETSOI. A gate dielectric layer is deposited on the protective cap and the ETSOI after removing the dummy gate. A replacement metal gate is then formed on the gate dielectric layer to replace the removed dummy gate, the gate dielectric layer is removed from the protective metal cap, and the protective cap is removed from the raised source/drain regions.

9 Claims, 8 Drawing Sheets

(56) References Cited

U.S. PATENT DOCUMENTS

| | | | |
|---|---|---|---|
| 7,867,863 B2 | 1/2011 | Chang | |
| 8,022,488 B2 | 9/2011 | Cheng et al. | |
| 8,039,966 B2 | 10/2011 | Yang et al. | |
| 8,338,260 B2* | 12/2012 | Cheng et al. | 438/300 |
| 8,435,846 B2* | 5/2013 | Cheng et al. | 438/197 |
| 8,486,778 B2* | 7/2013 | Haran et al. | 438/230 |
| 8,492,854 B1* | 7/2013 | Cheng et al. | 257/412 |
| 8,518,758 B2* | 8/2013 | Yang et al. | 438/151 |
| 8,673,708 B2* | 3/2014 | Cheng et al. | 438/183 |
| 2005/0112811 A1* | 5/2005 | Hsu et al. | 438/197 |
| 2006/0157797 A1* | 7/2006 | Tateshita | 257/369 |
| 2007/0120199 A1 | 5/2007 | Pan et al. | |
| 2008/0258216 A1* | 10/2008 | Kikuchi | 257/344 |
| 2009/0039426 A1* | 2/2009 | Cartier et al. | 257/344 |
| 2011/0037125 A1 | 2/2011 | Cheng et al. | |
| 2011/0227157 A1* | 9/2011 | Yang et al. | 257/347 |
| 2011/0233688 A1* | 9/2011 | Ren et al. | 257/408 |
| 2011/0316083 A1* | 12/2011 | Cheng et al. | 257/365 |
| 2012/0313168 A1* | 12/2012 | Cheng et al. | 257/347 |
| 2012/0326232 A1* | 12/2012 | Cheng et al. | 257/347 |
| 2013/0032876 A1* | 2/2013 | Cheng et al. | 257/327 |
| 2013/0082308 A1* | 4/2013 | Cheng et al. | 257/288 |
| 2013/0082311 A1* | 4/2013 | Cheng et al. | 257/288 |
| 2013/0161745 A1* | 6/2013 | Ando et al. | 257/347 |
| 2013/0161763 A1* | 6/2013 | Ando et al. | 257/408 |
| 2013/0292767 A1* | 11/2013 | Yang et al. | 257/347 |
| 2013/0344669 A1* | 12/2013 | Feng et al. | 438/286 |
| 2014/0001574 A1* | 1/2014 | Chen et al. | 257/410 |
| 2014/0042521 A1* | 2/2014 | Cheng et al. | 257/327 |
| 2014/0042542 A1* | 2/2014 | Cheng et al. | 257/347 |
| 2014/0042543 A1* | 2/2014 | Cheng et al. | 257/347 |
| 2014/0051216 A1* | 2/2014 | Cheng et al. | 438/151 |
| 2014/0124845 A1* | 5/2014 | Cheng et al. | 257/310 |
| 2014/0131735 A1* | 5/2014 | Hoentschel et al. | 257/77 |
| 2014/0141575 A1* | 5/2014 | Cheng et al. | 438/155 |
| 2014/0145254 A1* | 5/2014 | Cheng et al. | 257/310 |
| 2014/0167164 A1* | 6/2014 | Adam et al. | 257/347 |

OTHER PUBLICATIONS

CMOS Transistor Scaling Past 32nm and Implications on Variation; Kelin J. Kuhn; Intel Corporation, Portland Technology Development; RA3-353. 2501 NW 229th Ave., Hillsboro, OR 97124 (kelin.ptd.kuhn@intel.com); ©2010 IEEE (6 pages).

Selective Chemical Vapor Deposition-Grown Ru for Cu Interconnect Capping Applications; C.-C. Yang, F. R. McFeely, P.-C. Wang, K. Chanda, and D. C. Edelsteina; Electrochemical and Solid-State Letters, 13 (5) D33-D35 (2010) 1099-0062/2010/13~5!/D33/3/ © The Electrochemical Society (3 pages).

* cited by examiner

SEMICONDUCTOR DEVICE WITH REPLACEMENT METAL GATE AND METHOD FOR SELECTIVE DEPOSITION OF MATERIAL FOR REPLACEMENT METAL GATE

BACKGROUND

The exemplary embodiments of this invention relate generally to semiconductor devices and, more specifically, to semiconductor devices having raised sources/drains and replacement metal gates formed by selective metal deposition.

A semiconductor device such as a field effect transistor (FET) can be fabricated on a bulk semiconductor substrate or on a silicon-on-insulator (SOI) substrate. The FET (or other device) may have source and drain regions that protrude above the surface of the substrate to define raised sources and drains. A gate overlies a channel extending between the raised sources and drains and controls the flow of current between the source and drain regions.

In forming a gate for a semiconductor device having raised sources and drains, a dummy gate is formed on the substrate, and the raised sources and drains are formed around the dummy gate. The dummy gate is then removed and replaced by an electrically conductive metal-containing gate (a replacement metal gate (RMG)). An interlayer dielectric (ILD) may be used to cover the raised sources and drains while removing the dummy gate structure. The ILD is then subjected to a chemical-mechanical polish (CMP).

During the CMP of the ILD, the raised sources and drains may be exposed. Once the raised sources and drains are exposed, materials used to remove the dummy gate (e.g., acid etchants) may undesirably affect the material of the raised sources and drains.

BRIEF SUMMARY

In one exemplary aspect, a method is directed to the fabrication of a semiconductor device. In this method, a substrate is provided, the substrate having an extremely thin silicon-on-insulator (ETSOI) layer at the surface. A dummy gate is formed on the ETSOI, and at least two raised source/drain regions are formed adjacent to the dummy gate with a protective cap being formed on each of the raised source/drain regions. The dummy gate is then removed from the ETSOI, and a gate dielectric layer is deposited on the protective cap and the ETSOI. A replacement metal gate is formed on the gate dielectric layer to replace the removed dummy gate. The gate dielectric layer is removed from the protective metal cap, and the protective cap is removed from the raised source/drain regions.

In another exemplary aspect, another method is directed to the fabrication of a semiconductor device. In this method, a silicon-on-insulator (SOI) substrate comprising a buried oxide layer and an ETSOI layer between the buried oxide layer and a surface of the SOI substrate is provided. A dummy gate is formed on the ETSOI. At least two raised source/drain regions are epitaxially formed adjacent to the dummy gate, and a protective cap is formed on the source/drain regions. An etch process employing at least one acid is used to remove the dummy gate from the ETSOI. A gate dielectric layer is deposited on the protective cap and the ETSOI after removing the dummy gate. A replacement metal gate is then formed on the gate dielectric layer to replace the removed dummy gate, the gate dielectric layer is removed from the protective metal cap, and the protective cap is removed from the raised source/drain regions.

In another exemplary aspect, another method is directed to the fabrication of a semiconductor device. In this method, an SOI substrate comprising a buried oxide layer and an ETSOI layer between the buried oxide layer and a surface of the substrate is provided. A dummy gate and at least two raised source/drain regions are formed on the substrate. A protective cap is formed on each source/drain region. At least one acid is used to remove the dummy gate, a gate dielectric layer is deposited on the protective cap and the ETSOI, and a replacement metal gate is formed on the gate dielectric layer. The gate dielectric layer is removed from the protective metal cap, and the protective cap is removed from the raised source/drain regions. A passivation layer is formed on the replacement metal gate, and a silicide contact is formed on each of the raised source/drain regions. A dielectric layer is then deposited on the passivation layer and on the silicide contacts. First vias are formed through the dielectric layer to the silicide contacts, and a second via is formed through the dielectric layer and the passivation layer to the replacement metal gate.

In yet another exemplary aspect, a similar method is directed to the fabrication of a semiconductor device. This method is similar to that as defined above. However, after forming a passivation layer on the replacement metal gate and depositing a dielectric layer on the passivation layer and on the raised source/drain regions, first vias are formed through the dielectric layer to the raised source/drain regions. A silicide contact is then formed on each of the raised source/drain regions through the first vias, and a second via is formed through the dielectric layer and the passivation layer to the replacement metal gate.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

In exemplary embodiments of the present invention, a semiconductor device (such as a field effect transistor (FET)) having raised source/drain regions is fabricated on a bulk semiconductor substrate or on a silicon-on-insulator (SOI) layer. A dummy gate structure is employed during the fabrication of the semiconductor device to allow for the epitaxial growth of the raised source/drain regions. In a process of replacing the dummy gate structure with a replacement metal gate (RMG), a metal is selectively deposited on conductive materials of the semiconductor device to form a protective metal cap on the raised source/drain regions before the removal of the dummy gate structure. The metal cap protects the raised source/drain regions during the dummy gate structure removal process and may be removed in a final high k/metal gate polish process.

Figure 1:
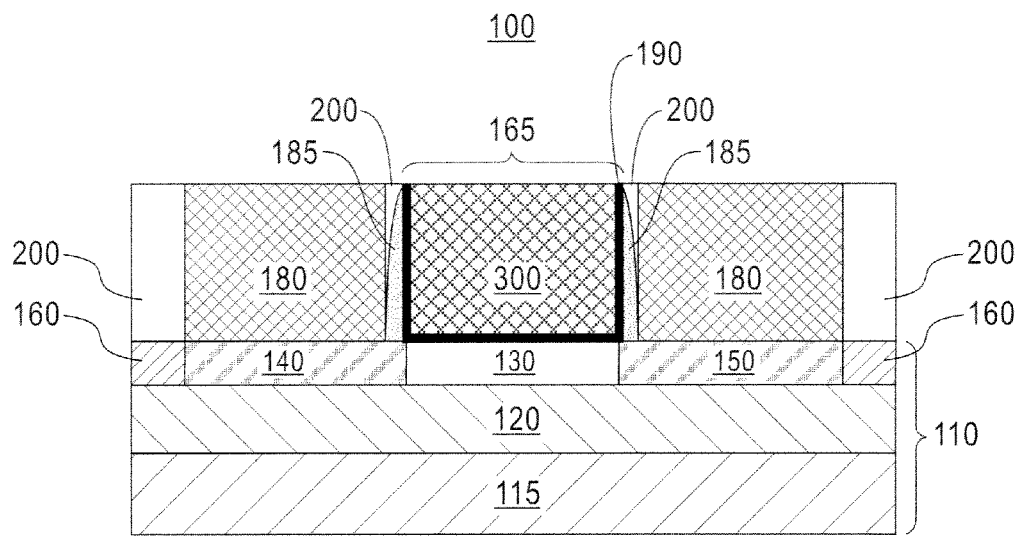
FIG. 1 is a side cross-sectional view of one exemplary embodiment of an apparatus capable of serving as a base structure for use in fabricating a semiconductor device.

As shown in FIG. 1, one exemplary embodiment of an apparatus capable of serving as a base structure for use in fabricating the semiconductor device is designated generally by the reference number 100 and is hereinafter referred to as "apparatus 100." Apparatus 100 comprises a substrate 110 having an SOI layer 115. An insulating layer 120 is formed in the substrate 110 such that an extremely thin SOI layer (ETSOI layer 130) is defined over the insulating layer 120 and on an upper surface of the substrate 110.

A gate region 165 is defined on the ETSOI layer 130. The gate region 165 comprises an RMG 300, a gate dielectric layer 190 comprising high k dielectric material on the RMG 300, and insulating spacers 185 on the gate dielectric layer 190. A portion of the gate dielectric layer 190 is deposited on a bottom surface of the RMG 300 to insulate the metal of the RMG 300 from the ETSOI layer 130. Another portion of the gate dielectric layer 190 is deposited on sidewalls of the RMG 300. The insulating spacers 185 are positioned on the gate dielectric layer 190.

A source region 140 and a drain region 150 are defined in the ETSOI 130 on opposing sides of the gate region 165. A raised source region and a raised drain region are respectively formed on the source region 140 and the drain region 150 to define the raised sources and drains, which are hereinafter collectively referred to as raised source/drain regions 180. Isolation areas (e.g., shallow trench isolation (STI) areas) 160 are formed adjacent to each of the source region 140 and drain region 150.

An interlayer dielectric 200 (ILD 200) is deposited adjacent to the raised source/drain regions 180 and over the isolation areas 160 as well as adjacent to the raised source/drain regions 180 and over the spacers 185.

Figure 2:
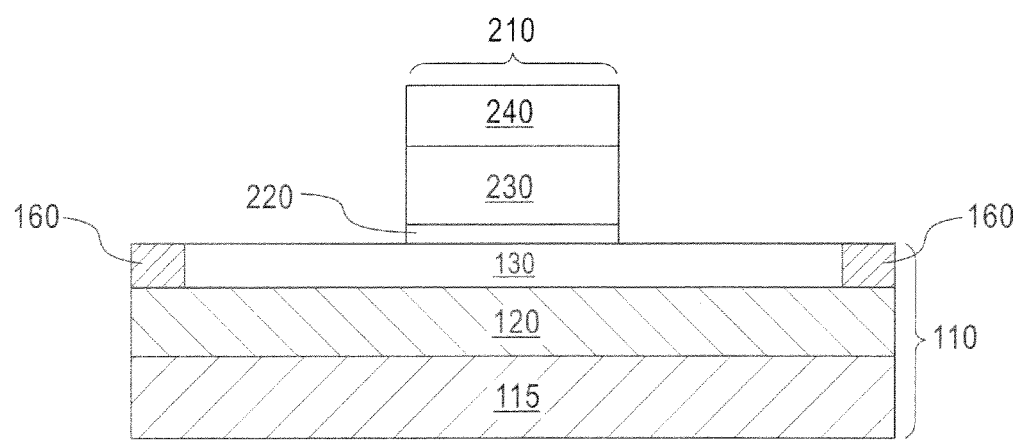
FIG. 2 is a side cross-sectional view in the fabrication of the apparatus of FIG. 1 wherein a dummy gate is formed on a substrate.

Referring now to FIGS. 2-8, one exemplary embodiment of a process of fabricating the apparatus of FIG. 1 for use in an integrated circuit (IC) chip is shown. In FIG. 2, the substrate 110 is provided. The substrate 110 includes the SOI layer 115, which may be any semiconducting material including, but not limited to, silicon carbide (SiC), silicon alloys, germanium, germanium alloys, alloys of silicon and germanium ($Si_xGe_y$), gallium arsenide (GaAs), indium arsenide (InAs), indium phosphide (InP), and the like.

The insulating layer 120 is formed in the substrate 110 using an ion beam implantation process to implant oxygen ions into the material of the SOI layer 115. Once the oxygen ions are implanted, the substrate 110 is annealed. When the substrate 110 comprises silicon, the implantation of oxygen ions and subsequent annealing forms the buried insulating layer 120 of silicon dioxide ($SiO_2$) in the substrate 110. Implantation of ions in the SOI layer 115 of the substrate 110 to form the buried insulating layer 120 defines the ETSOI layer 130 over the insulating layer 120.

The isolation areas 160 are formed in the ETSOI layer 130 to contact or extend the underlying insulating layer 120. The isolation areas 160 may be formed by etching trenches in the ETSOI layer 130, depositing a dielectric material (e.g., $SiO_2$) to fill the trenches, and planarizing using a chemical-mechanical polish (CMP).

To form the gate region 165 for the RMG 300, a dummy gate 210 is formed on the ETSOI layer 130. In forming the dummy gate 210, a dummy $SiO_2$ layer 220 is deposited on the ETSOI layer 130, a dummy polysilicon layer 230 is formed on the dummy $SiO_2$ layer 220, and a nitride cap 240 is formed on the dummy $SiO_2$ layer 220. Layers 220, 230 and the nitride cap 240 collectively define a stack. The dummy $SiO_2$ layer 220 is formed on the ETSOI layer 130 by either atmospheric pressure chemical vapor deposition (APCVD) or low pressure chemical vapor deposition (LPCVD). The dummy polysilicon layer 230 is formed on the dummy $SiO_2$ layer by LPCVD. The nitride cap 240, which may comprise silicon nitride (SiN or $Si_3N_4$) or the like, is deposited on the dummy polysilicon layer 230 by LPCVD.

Figure 3:
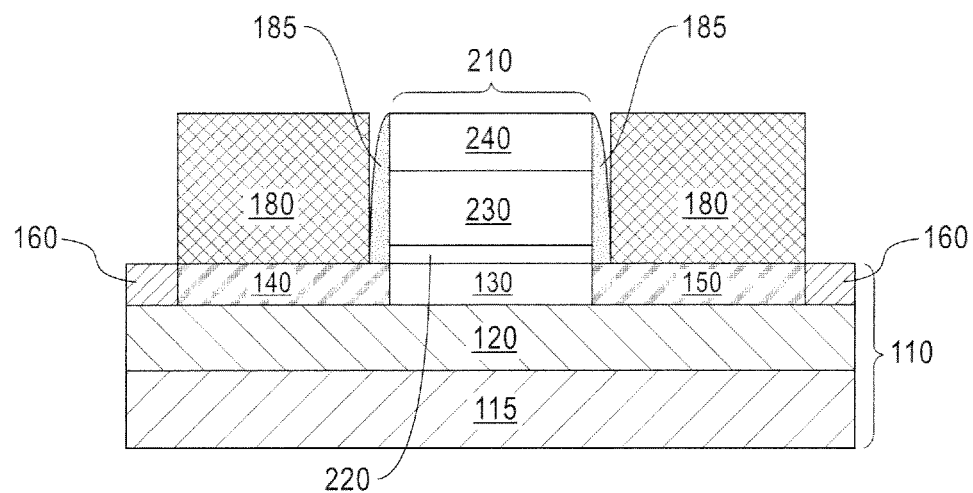
FIG. 3 is a side cross-sectional view in the fabrication of the apparatus of FIG. 2 wherein raised sources and drains are formed on the substrate.

As shown in FIG. 3, the spacers 185 are formed by the deposition of a hardmask material on sides of the stack defined by the dummy $SiO_2$ layer 220, the dummy polysilicon layer 230, and the nitride cap 240. Hardmask materials from which the spacers are formed may be any dielectric material including, but not limited to, SiN, $Si_3N_4$, $SiO_2$, silicon carbon nitride, and the like.

The raised source/drain regions 180 are formed on the source region 140 and drain region 150 using a selective epitaxial growth process such as vapor phase epitaxy, which is a form of chemical vapor deposition (CVD). Epitaxial growth refers to the deposition of a crystalline overlayer on a crystalline sub-layer where the overlayer registers with the structure of the crystalline sub-layer. After the epitaxial growth of the raised source/drain regions 180, the raised source/drain regions 180 are doped either by in-situ epitaxy or implantation of ions such as phosphorous or boron. If ions are implanted into the raised source/drain regions 180, an annealing process is applied to the raised source/drain regions 180.

Figure 4:
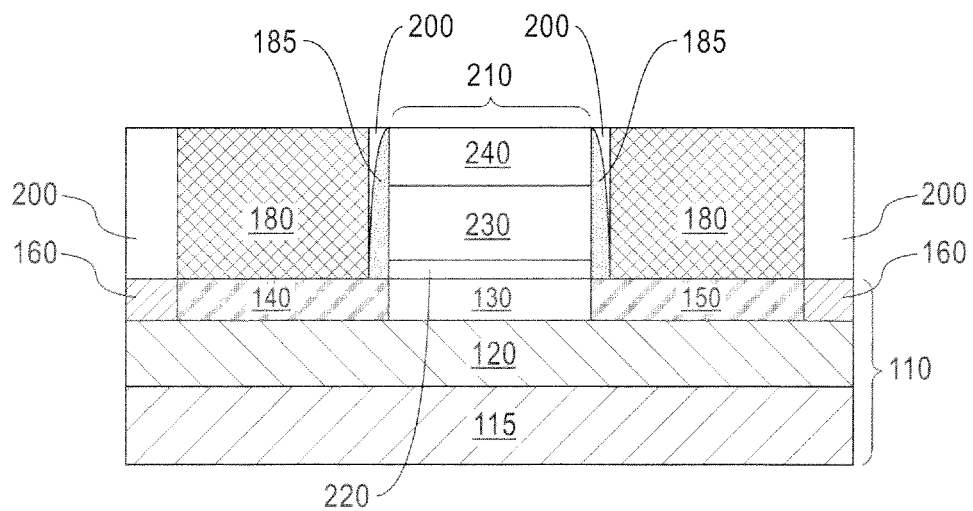
FIG. 4 is a side cross-sectional view in the fabrication of the apparatus of FIG. 3 wherein an interlayer dielectric is deposited adjacent the raised sources and drains.

As shown in FIG. 4, the ILD 200 is deposited on the isolation areas 160 and side surfaces of the raised source/drain regions 180 as well as between the side surfaces of the raised source/drain regions 180 and the spacers 185 by CVD. Excess material of the ILD 200 may be deposited on the tops of the raised source/drain regions 180 and the dummy gate 210. The resulting structure is planarized using CMP to remove the excess material of the ILD 200 such that surfaces of the raised source/drain regions 180 and the dummy gate 210 are exposed and a thick layer of deposited ILD 200 is disposed over the isolation areas 160. Materials from which the ILD 200 may be formed include oxides such as $SiO_2$.

Figure 5:
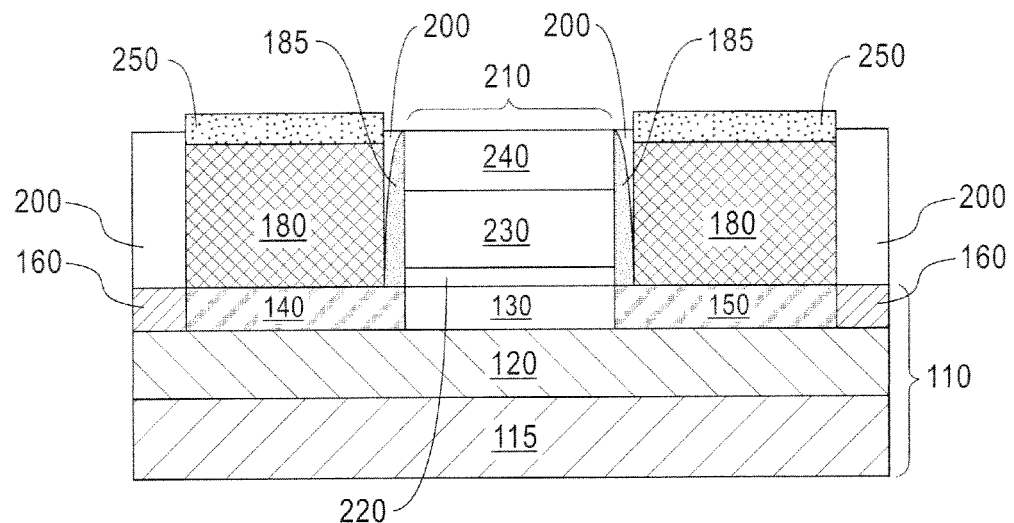
FIG. 5 is a side cross-sectional view in the fabrication of the apparatus of FIG. 4 wherein a protective cap is formed on the raised sources and drains.

As shown in FIG. 5, a protective cap 250 is formed on the raised source/drain regions 180. The protective cap 250 is a metal layer formed by a selective deposition process (e.g., vapor deposition). In the selective deposition process, the metal is deposited only on the conductive material (the doped raised source/drain regions 180) and not on the insulative material (the nitride cap 240 of the dummy gate 210 and the oxide of the ILD 200). Metals that may be deposited include, but are not limited to, molybdenum, tantalum, titanium, nickel, and tungsten.

Figure 6:
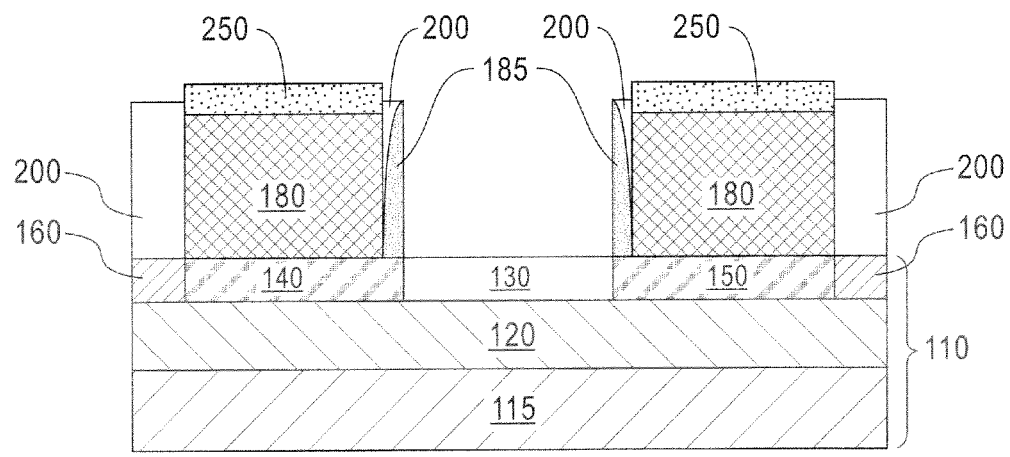
FIG. 6 is a side cross-sectional view in the fabrication of the apparatus of FIG. 5 wherein the dummy gate is removed.

As shown in FIG. 6, the dummy gate 210 is removed to accommodate the RMG 300. To remove the dummy gate 210, the nitride cap 240 is removed using one or more of a dry etch process (e.g., a reactive ion etch (RIE), plasma etching, or the like) and a wet etch process using phosphoric acid ($H_3PO_4$). Preferably, the nitride cap 240 is removed using the dry etch process. Once the nitride cap 240 is removed, the dummy polysilicon layer 230 is removed using the RIE. The dummy $SiO_2$ layer 220 is then removed using hydrofluoric acid (HF). In the process of removing the dummy gate 210, the protective cap 250 (as well as the spacers 185 and the ILD 200) protects the raised source/drain regions 180 from undesirable effects of the acid(s).

Figure 7:
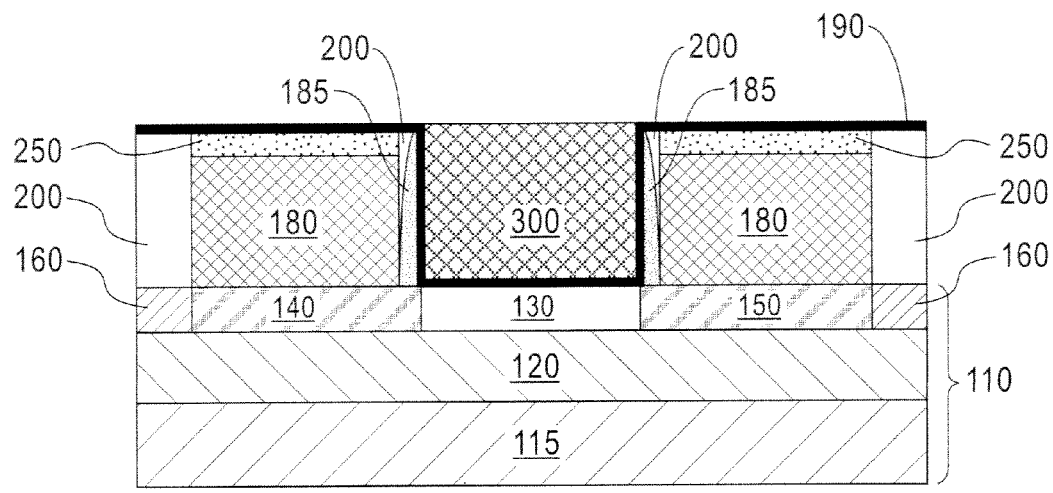
FIG. 7 is a side cross-sectional view in the fabrication of the apparatus of FIG. 6 wherein a gate dielectric layer is deposited in a void formed by the removal of the dummy gate and a gate metal is formed on a portion of the gate dielectric layer.

As shown in FIG. 7, the gate dielectric layer 190 is conformally deposited on the protective cap 250, the ILD 200, and surfaces of the spacers 185 and the ETSOI 130 that define a void from which the dummy gate 210 was removed. The gate dielectric layer 190 is deposited using CVD to a thickness of about 1 nm to about 10 nm, with about 1 nm to about 2 nm being preferred. Materials from which the gate dielectric layer 190 may be formed are typically high k dielectric materials such as oxides of tantalum, zirconium, or aluminum. However, the materials of the gate dielectric layer 190 are not limited in this regard, as $SiO_2$ or $Al_3N_4$ may be employed.

The RMG 300 is deposited on the gate dielectric layer 190 in the void formed by the removal of the dummy gate 210. The RMG 300 comprises the gate metal, which is preferably a metal such as aluminum, nickel, tantalum, tantalum nitride, titanium, titanium nitride, TiAl alloy, ruthenium, tungsten, and the like. The metal is deposited to form the RMG 300 via any suitable process including, but not limited to, vapor deposition. The void into which the metal is deposited to form the RMG 300 may be overfilled. In instances in which the metal is deposited to overfill the void to form the RMG 300, the metal is polished to remove metal down to the level of the gate dielectric layer 190.

Figure 8:
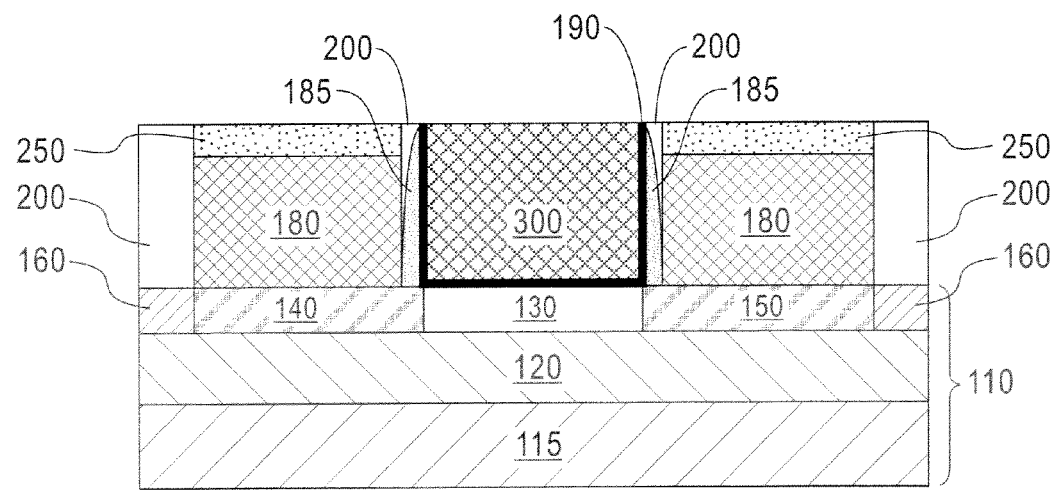
FIG. 8 is a side cross-sectional view in the fabrication of the apparatus of FIG. 7 wherein a portion of the gate dielectric layer is removed.

As shown in FIG. 8, the exposed gate dielectric layer 190 is removed from the surfaces of the ILD 200 and protective cap 250. Some of the material of the RMG 300 may also be removed. The exposed gate dielectric layer 190 is removed using a dry etch process (e.g., RIE), a wet etch process (e.g., HF), or a combination of dry etch and wet etch processes. A portion of the gate dielectric layer 190 equal to the thickness of the gate dielectric layer 190 remains exposed between the ILD 200 deposited on the spacers 185 and the RMG 300. Once the materials of the etch process are cleaned from the surface defined by the exposed ILD 200, protective cap 250, and RMG 300, the surface is planarized using the CMP to remove the protective cap 250 formed on the raised source/drain regions 180 such that a surface of the raised source/drain regions 180 is substantially coplanar with the surface of the RMG 300, thereby producing the apparatus 100 as shown in FIG. 1.

Figure 9:
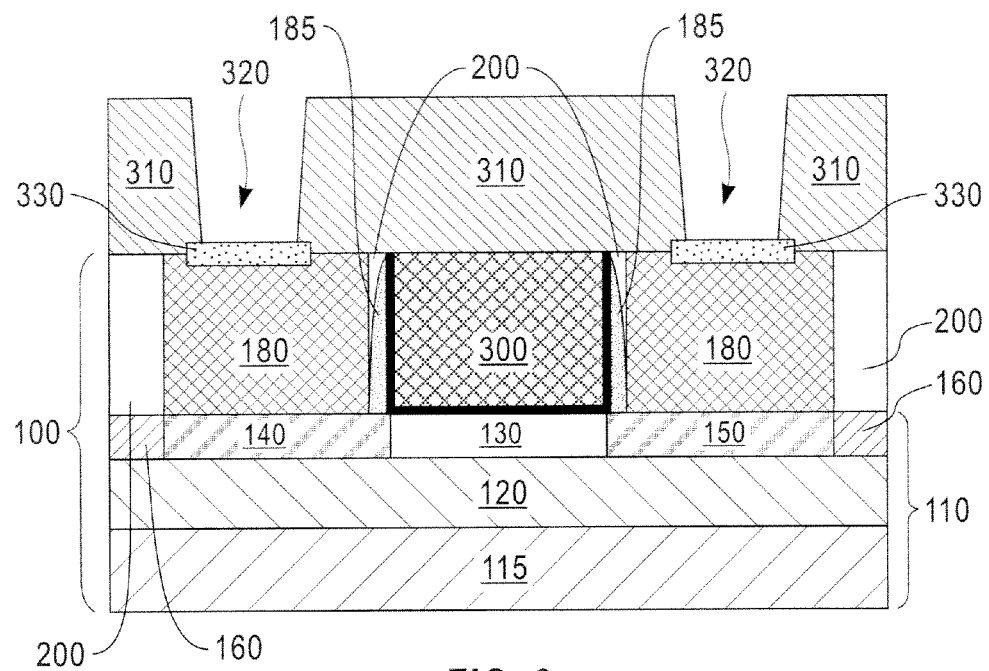
FIG. 9 is a side cross-sectional view of the apparatus as formed in FIG. 8 on which a second interlayer dielectric is deposited and in which silicide contacts are formed in vias after deposition of the second interlayer dielectric.

As shown in FIG. 9, the apparatus 100 is further processed for use in an IC chip. A second ILD 310 is deposited on the apparatus 100, and source/drain vias 320 are formed in the deposited second ILD 310 to provide communication to the raised source/drain regions 180. The second ILD 310 is an oxide such as $SiO_2$ and is deposited on the apparatus 100 using CVD. The source/drain vias 320 are formed in the second ILD 310 using patterning and etching techniques.

Silicide contacts 330 are formed in the source/drain vias 320 at the surfaces of the raised source/drain regions 180. In forming the silicide contacts 330, a silicide of a suitable metal is deposited to a depth of about 10 nm to about 20 nm. The silicide contacts 330 may be formed by any suitable means, such as metal deposition on silicon and formation of the silicide by thermal heating, laser irradiation, or ion beam mixing; co-evaporation of the metal and silicon; sputtering; or CVD. Exemplary metals from which the silicide may be formed include, but are not limited to, platinum, titanium, cobalt, nickel, tantalum, tungsten, or molybdenum.

Figure 10:
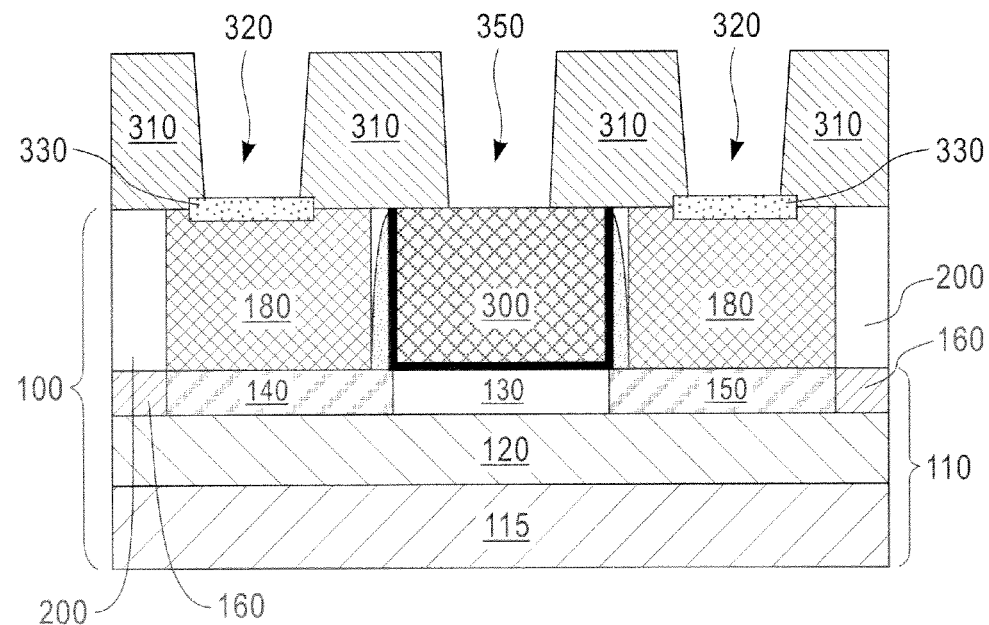
FIG. 10 is a side cross-sectional view of the second interlayer dielectric of FIG. 9 in which a via is formed to the gate metal.

As shown in FIG. 10, a gate via 350 is formed in the deposited second ILD 310 to provide communication to the RMG 300. The gate via 350 is formed in the second ILD 310 using patterning and etching techniques.

Figure 11:
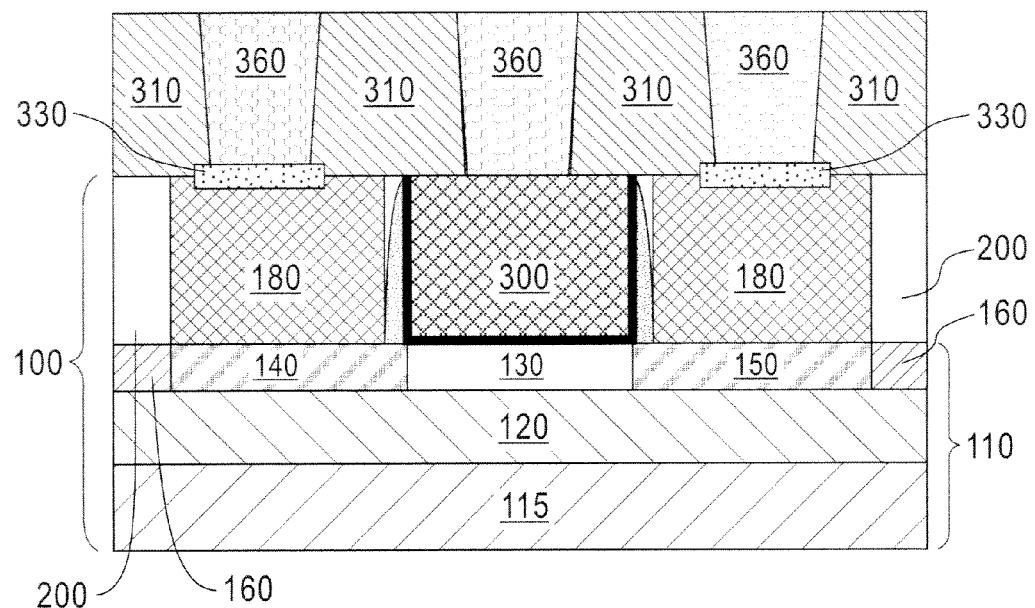
FIG. 11 is a side cross-sectional view of the vias of FIGS. 9 and 10 filled with a conductive metal.

As shown in FIG. 11, both the source/drain vias 320 and the gate via 350 are filled with a conductor 360. The conductor 360 is deposited in the source/drain vias 320 and the gate via 350 using any suitable metal deposition technique, such as vapor deposition. Preferably, the conductor 360 is a metal, such as tungsten (W) or the like.

Figure 12:
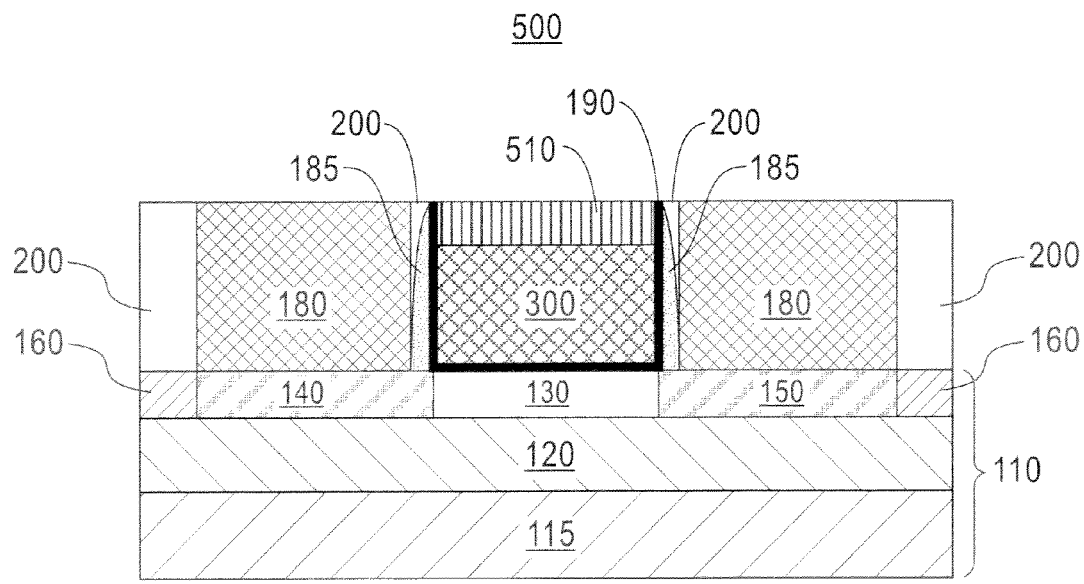
FIG. 12 is a side cross-sectional view of another exemplary embodiment of an apparatus capable of serving as a base structure for use in fabricating a semiconductor device.
Figure 13:
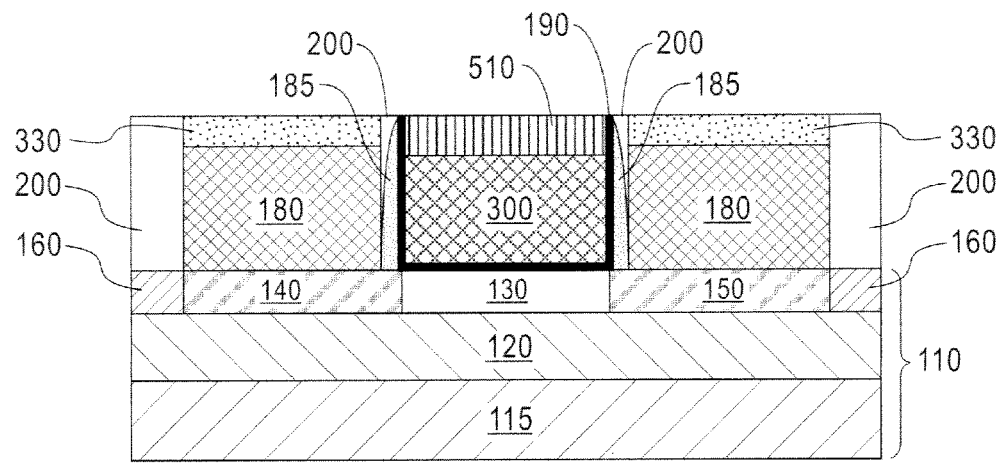
FIG. 13 is a side cross-sectional view of the apparatus of FIG. 12 in which silicide contacts are formed before deposition of a second interlayer dielectric.
Figure 14:
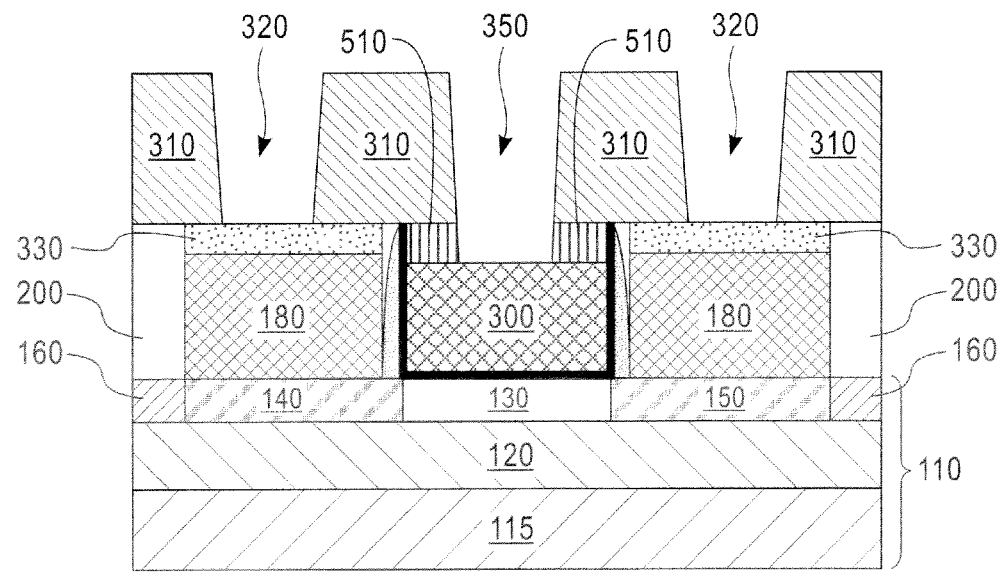
FIG. 14 is a side cross-sectional view of the apparatus of FIG. 13 in which the second interlayer dielectric is deposited on the silicide contacts and gate and forms vias to the silicide contacts and the gate.

Referring now to FIGS. 12-14, another exemplary embodiment of a process of fabricating an apparatus capable of serving as a base structure for use in fabricating the FET (or other device) is shown. In FIG. 12, an apparatus 500 is similar to apparatus 100 of FIG. 1 but includes a passivation layer 510 deposited on the RMG 300. The passivation layer 510 is generally an oxide of the metal of the RMG 300. For example, when the material of the RMG 300 is aluminum, the passivation layer 510 is a layer of aluminum oxide ($Al_2O_3$) formed by exposing the aluminum gate material to an environment containing oxygen.

As shown in FIG. 13, the silicide contacts 330 are formed on the raised source/drain regions 180 of the apparatus 500 prior to forming the vias in the second ILD deposited on the apparatus 500. The silicide contacts 330 are silicides of metals as described above, are deposited on the raised source/drain regions 180 using techniques as described above, and are deposited to depths of about 10 nm to about 20 nm. During the deposition of the silicide contacts 330, the passivation layer 510 protects the metal of the RMG 300 and prevents deposition of silicide thereon.

As shown in FIG. 14, the second ILD 310 is deposited on the apparatus 500 and on the silicide contacts 330. The second ILD 310 is an oxide such as $SiO_2$ deposited on the apparatus 500 using CVD. Source/drain vias 320 are formed in the second ILD 310 so as to extend to the silicide contacts 330 on the raised source/drain regions 180. The gate via 350 is also formed in the second ILD 310 so as to extend through the passivation layer 510 to the RMG 300. Both the source/drain vias 320 and the gate via 350 are formed using patterning and etching techniques.

Figure 15:
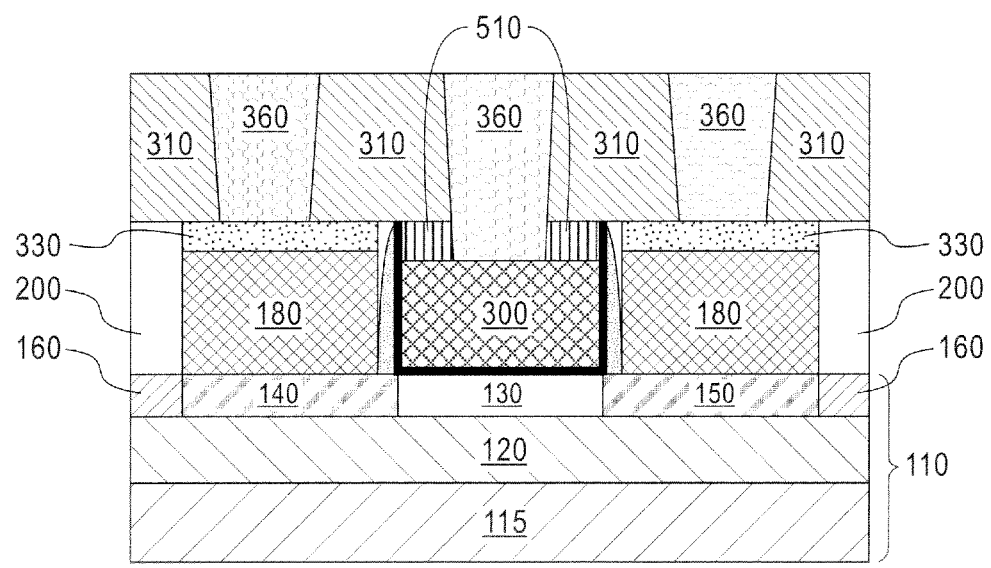
FIG. 15 is a side cross-sectional view of the vias of FIG. 13 filled with a conductive metal.

As shown in FIG. 15, both the source/drain vias 320 and the gate via 350 are filled with the conductor 360. The conductor 360 is deposited in the source/drain vias 320 and the gate via 350 using any suitable deposition technique, such as vapor deposition. Preferably, the conductor 360 is a metal, such as tungsten (W), aluminum (Al), or the like.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method for fabricating a semiconductor device, comprising:
   forming a dummy gate on a substrate having an extremely thin SOI (ETSOI) layer at a surface of the substrate;
   forming at least two raised source/drain regions adjacent to the dummy gate;
   forming a protective cap on the at least two raised source/drain regions;
   removing the dummy gate from the ETSOI;
   depositing a gate dielectric layer on the protective cap and on the ETSOI after removing the dummy gate from the ETSOI;
   forming a replacement metal gate on the gate dielectric layer to replace the removed dummy gate;
   removing the gate dielectric layer from the protective cap; and
   removing the protective cap from the at least two raised source/drain regions;
   wherein forming the protective cap on the at least two raised source/drain regions comprises selectively depositing a metal layer on the at least two raised source/drain regions; and
   wherein forming the dummy gate on the ETSOI comprises, depositing a dummy $SiO_2$ layer on the ETSOI,
      depositing a dummy polysilicon layer on the dummy $SiO_2$ layer,
      forming a nitride cap on the dummy polysilicon layer, and
      forming spacers adjacent a stack defined by the dummy $SiO_2$ layer, the dummy polysilicon layer, and the nitride cap.

2. The method of claim 1, wherein the substrate further comprises a buried insulating layer.

3. The method of claim 1, wherein forming the at least two raised source/drain regions adjacent to the dummy gate comprises epitaxially growing the at least two raised source/drain regions on a respective source region and a respective drain region.

4. The method of claim 1, further comprising depositing an interlayer dielectric adjacent to the at least two raised source/drain regions.

5. The method of claim 1, wherein removing the dummy gate from the ETSOI comprises,
   using one or more of a dry etch process and a wet etch process with $H_3PO_4$ to remove the nitride cap,
   using a reactive ion etch process to remove the dummy polysilicon layer, and
   using HF to remove the dummy $SiO_2$ layer;
   wherein the protective cap protects the at least two raised source/drain regions from the $H_3PO_4$, if present, and the HF.

6. A method for fabricating a semiconductor device, comprising:
   forming a dummy gate on an ETSOI layer of a substrate, the substrate having an SOI layer, a buried oxide layer on the SOI layer, and the ETSOI layer on the buried oxide layer;
   epitaxially forming at least two raised source/drain regions adjacent to the dummy gate;
   forming a protective cap on the at least two raised source/drain regions;
   using an etch process employing at least one acid to remove the dummy gate from the ETSOI layer;
   depositing a gate dielectric layer on the protective cap and on the ETSOI layer after removing the dummy gate from the ETSOI layer;
   forming a replacement metal gate on the gate dielectric layer to replace the removed dummy gate; and
   removing the gate dielectric layer from the protective metal cap and the protective cap from the at least two raised source/drain regions.

7. The method of claim 6, further comprising depositing an interlayer dielectric adjacent to the at least two raised source/drain regions.

8. The method of claim 6, wherein forming a protective cap on the at least two raised source/drain regions comprises selectively depositing a metal on the at least two raised source/drain regions by vapor deposition.

9. The method of claim 6, wherein using an etch process employing at least one acid to remove the dummy gate from the ETSOI layer comprises,
   applying one or more of a dry etch process and an $H_3PO_4$ wet etch process,
   applying a reactive ion etch process, and
   applying HF;
   wherein the $H_3PO_4$, if present, and the HF are prevented from contacting the at least two raised source/drain regions by the protective cap.

* * * * *